United States Patent [19]
Chern et al.

[11] Patent Number: 5,128,560
[45] Date of Patent: Jul. 7, 1992

[54] BOOSTED SUPPLY OUTPUT DRIVER CIRCUIT FOR DRIVING AN ALL N-CHANNEL OUTPUT STAGE

[75] Inventors: Wen-Foo Chern; Kurt P. Douglas, both of Boise, Id.

[73] Assignee: Micron Technology, Inc., Boise, Id.

[21] Appl. No.: 673,746

[22] Filed: Mar. 22, 1991

[51] Int. Cl.$^5$ .......................................... H03K 17/06
[52] U.S. Cl. ................................... 307/475; 307/443; 307/482; 307/296.1
[58] Field of Search ............... 307/448, 443, 450, 451, 307/452, 453, 270, 585, 475, 296.2, 296.1, 465, 482; 365/104, 226

[56] References Cited

U.S. PATENT DOCUMENTS

| | | | |
|---|---|---|---|
| 4,500,799 | 2/1985 | Sud et al. | 307/482 X |
| 4,506,164 | 3/1985 | Higuchi | 307/475 X |
| 4,570,244 | 2/1986 | Sud et al. | 307/482 X |
| 4,612,461 | 9/1986 | Sood | 302/296.2 X |
| 4,675,544 | 6/1987 | Schrenk | 307/475 X |
| 4,692,638 | 9/1987 | Stiegler | 307/482 X |
| 4,772,812 | 9/1988 | Desmarais | 307/482 X |
| 4,837,460 | 6/1989 | Uchida | 307/296.2 X |
| 4,982,113 | 1/1991 | Jinbo | 307/465 |
| 5,038,325 | 8/1991 | Douglas et al. | 365/189.06 |
| 5,048,016 | 9/1991 | Schwendt | 307/482 X |

Primary Examiner—David Hudspeth
Attorney, Agent, or Firm—Marger, Johnson, McCollom & Stolowitz

[57] ABSTRACT

An output driver circuit includes first and second translator circuits and a boosted voltage generator. The output driver circuit is suitable for driving the first and second inputs of a reduced voltage N-channel output stage. The first and second translator circuits each have a power terminal and an input for receiving first and second logic input signals. A boost voltage generator having a boosted voltage output is respectively coupled to the power terminals of the first and second translator circuits. The first translator circuit has an output coupled to the first input of the N-channel output stage for providing a boosted logic output signal in a logic high polarity state. The second translator circuit has an output coupled to the second input of the N-channel output stage for providing a boosted logic output signal in a logic high polarity state. The outputs of the first and second translator circuits are complementary for driving the N-channel output stage to provide a valid output logic signal. Alternatively, the outputs of the first and second translator circuits are both low for placing the N-channel output stage into a high impedance tristate mode.

22 Claims, 5 Drawing Sheets

BOOSTED SUPPLY OUTPUT DRIVER CIRCUIT FOR DRIVING AN ALL N-CHANNEL OUTPUT STAGE

BACKGROUND OF THE INVENTION

This invention relates generally to output driver circuits for driving the inputs of an output stage, and more particularly to those output driver circuits capable of driving the inputs of an all N-channel output stage with a boosted voltage.

Two types of field-effect transistor ("FET") output stages are shown in FIGS. 1A and 1B. Referring to FIG. 1A, output stage 20 has two N-channel transistors 22 and 24. Transistor 22 is normally referred to as a "pullup" transistor, and transistor 24 is normally referred to as a "pulldown" transistor. The gates of transistors 22 and 24 form first and second inputs 23 and 25. The drain of transistor 22 is coupled to a supply voltage VCC, typically five volts, at terminal 21. The source of transistor 24 is coupled to a negative supply voltage or ground at terminal 28. The source of transistor 22 and the drain of transistor 24 are coupled together to form an output 32.

In a normal mode of operation, the first and second inputs 23 and 25 are complementary and are therefore driven differentially. To produce a logic low voltage at output 32, input 23 is coupled to a logic low voltage and input 25 is coupled to a logic high voltage. Thus, transistor 22 is biased off and transistor 24 is biased on, effectively shorting output 32 to ground through the low drain-to-source resistance of transistor 24 and isolating output 32 from the supply voltage through the high drain-to-source resistance of transistor 24. To produce a logic high voltage at output 32, the polarities of the signals at inputs 23 and 25 are inverted. In a high impedance or "tristate" output mode, inputs 23 and 25 can also both be held low to turn off both transistors 22 and 24.

Referring to FIG. 1B, output stage 20A has a P-channel pullup transistor 22A and an N-channel pulldown transistor 24. As output state 20, the gates of transistors 22 and 24 form first and second inputs 23 and 25. The source of transistor 22 is coupled to the supply voltage VCC at terminal 21 and the source of transistor 24 is coupled to ground at terminal 28. The drains of transistors 22 and 24 are coupled together to form the output 32.

In a normal mode of operation, the first and second inputs 23 and 25 require the same polarity to switch the output 32. Therefore, inputs 23 and 25 can be coupled together to the same logic input signal. However, if a tristate output feature is desired, inputs 23 and 25 can be driven with two logic input signals. To produce a logic low voltage at output 32, inputs 23 and 25 are coupled together and to a logic high voltage. Thus, transistor 22A is biased off and transistor 24 is biased on, effectively shorting output 32 to ground and isolating output 32 from the supply voltage in the manner described above. To produce a logic high voltage at output 32, a logic low voltage is coupled to inputs 23 and 25, which biases on transistor 22A and biases off transistor 24.

Of the two output stages 20 and 20A shown in FIGS. 1A and 1B, output stage 20 is generally preferred. Since output stage 20 uses no P-channel transistors, the possibility of latch-up is minimized. However, in operation, the logic high voltage at the output 32 is diminished by the gate-to-source voltage required to bias on transistor 22. For example, if the input 23 is driven by a five volt signal, the VCC supply voltage is five volts, and the threshold voltage of transistor 22 is about one volt, then the output voltage at output 32 is about four volts. The output voltage can be even less of a load is coupled to output 32. The gate-to-source voltage drop of transistor 22 is usually not a problem since the minimum allowable logic high threshold of subsequent stages is less than four volts. For example, typical valid TTL logic levels are 2.4 volts for a minimum logic high threshold and 0.8 volts for a maximum logic low threshold. Therefore, as long as the power supply voltage VCC is kept at five volts, output stage 20 is capable of driving most TTL standard loads.

However, as the feature sizes of transistors shrink to enable higher levels of integration on a single integrated circuit, five volts can no longer be used as the power supply voltage. For example, gate widths of transistors used in a 4 megabit random access memory ("RAM") can be 0.6 $\mu$m to 0.8 $\mu$m or even less, while gate oxide can be 150 Angstroms to 200 Angstroms or less. The intensity of the electric field generated by a five volt power supply can affect the reliability of or even destroy and integrated circuit fabricated with sub-micron feature size transistors. Consequently, a lower power supply voltage such as 3.3 volts must be used to preserve the reliability and functionality of sub-micron integrated circuits.

While a lower voltage power supply solves the problem of intense electric fields, output stage 20 can no longer be used. With a 3.3 volt power supply, the voltage at the output 32 can be 2.3 volts unloaded or 2.0 volts loaded. This output voltage is not sufficient to drive a subsequent stage. The output voltage provided is within the "forbidden zone" between the allowable logic high and logic low TTL threshold levels and is therefore not a valid logic signal.

A prior method of providing a valid output voltage at the output 32 of the N-channel output stage 20 increased the voltage drive only at input 23. An output driver circuit was used to increase the voltage input above the level of the lower voltage power supply. However, such output driver circuits for increasing the voltage at input 23 typically involved complex circuitry having critical timing or delay paths.

Therefore, what is desired is a simple output driver circuit without any critical timing or delay paths for increasing the output voltage of an N-channel output stage coupled to a reduced voltage power supply.

SUMMARY OF THE INVENTION

It is, therefore, an object of the present invention to implement an output driver circuit with a simple design using a minimum number of transistors and having no critical timing or delay paths.

It is another object of the present invention to implement an output driver circuit having two voltage outputs for increasing the voltage drive at the gates of both of the output transistors.

It is an advantage of the present invention in that the higher gate voltage provided by the output driver circuit for both the pullup and pulldown output transistors establishes a valid output logic level having a higher logic high level and a lower logic low level.

It is another advantage of the present invention that the output voltage of the output stage is substantially isolated from noise and fluctuations of the external power supply.

It is a further advantage of the present invention that, because of the higher drive voltages, smaller output devices with lower capacitance can be used.

It is still a further advantage of the present invention that elevated voltage drive levels are well controlled, substantially isolating the output voltage from changes in the external VCC supply voltage.

According to the present invention, an output driver circuit includes first and second translator circuits and a boosted voltage generator. The output driver circuit is suitable for driving the first and second inputs of a reduced voltage N-channel output stage. The first and second translator circuits each have a power terminal and an input for receiving first and second logic input signals. A boost voltage generator having a boosted voltage output is respectively coupled to the power terminals of the first and second translator circuits. The first translator circuit has an output coupled to the first input of the N-channel output stage for providing a boosted logic output signal in a logic high polarity state. The second translator circuit has an output coupled to the second input of the N-channel output stage for providing a boosted logic output signal in a logic high polarity state. The outputs of the first and second translator circuits are complementary for driving the N-channel output stage to provide a valid output logic signal. Alternatively, the outputs of the first and second translator circuits are both low for placing the N-channel output stage into a high impedance tristate mode.

The foregoing and other objects, features and advantages of the invention will become more readily apparent from the following detailed description of a preferred embodiment which proceeds with reference to the drawings.

DETAILED DESCRIPTION OF THE INVENTION

Figure 2:
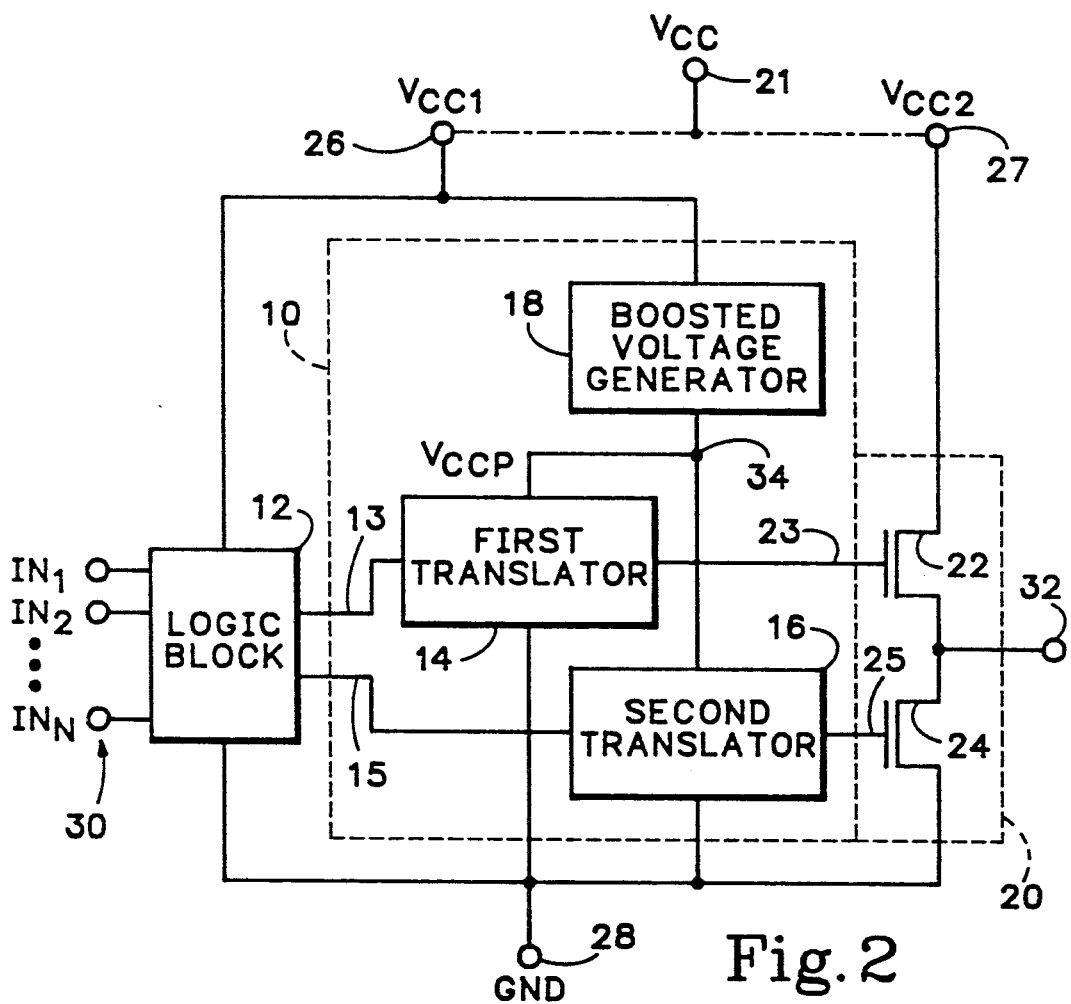
FIG. 2 is a combined block/schematic diagram of a an output driver circuit according to the present invention interposed between a logic block and an N-channel output stage.

Referring to FIG. 2, an output driver circuit 10 suitable for driving an N-channel output stage 20 includes a first translator circuit 14, a second translator circuit 16, and a boosted voltage generator 18. Logic input signals 13 and 15 are provided to the input of output driver circuit 10 by logic block 12. Logic block 12 represents any combination of logic circuitry having one or more input terminals 30 designated $IN_1$ through $IN_2$. Therefore, logic input signals 13 and 15 represent any desired logic signals, which may or may not be complementary. The nature of the logic input signals 13 and 15 depends only upon the output characteristics desired, as is explained in greater detail below. The N-channel output stage 20 has first and second inputs 23 and 25 that are driven by the outputs of translator circuits 14 and 16.

Power for the output driver circuit 10, the logic block 12, and the N-channel output stage 20 is provided by a positive power supply voltage $V_{CC}$ at terminal 21 and ground or a negative power supply voltage at terminal 28. The power supply voltage differential between terminals 21 and 28 is typically a reduced voltage of 3.3 volts suitable for high-density, sub-micron integrated circuits. Alternatively, separate power supplies VCC1 and VCC2, may be used. A first power supply, VCC1 at terminal 26, is used to provide power for the logic block 12 and the boosted voltage generator 18, whereas a second power supply, VCC2 at terminal 27, is used to provide power for the N-channel output stage 20. Separate power supplies enable different voltages to be used in order to further adjust output characteristics.

In operation, the first and second translator circuits 14 and 16 translate the low logic levels of the logic block 12 into complementary boosted logic levels that drive the inputs 23 and 25 of the N-channel output stage 20. If $V_{CC}$ is equal to a reduced voltage of 3.3 volts, the logic levels of the logic block 12 output are 3.3 volts for a logic high and zero volts for a logic low. Assuming that a translator circuit 14 or 16 is non-inverting, a logic high of 3.3 volts presented to the input produces a logic high at the output of 5 volts. A logic low of zero volts presented to the input produces a logic low at the output of zero volts. Assuming that a translator circuit 14 or 16 is inverting, a logic high of 3.3 volts presented to the input produces a logic low at the output of zero volts. A logic low of zero volts presented to the input produces a logic high at the output of 5 volts.

The logic block 12 and the first and second translator circuits 14 and 16 cooperate to place the output stage 20 into one of two modes. In a first mode, output stage 20 provides a valid logic signal, either high or low. In a second mode, output stage 20 provides a high impedance tristate mode. Therefore, the polarity of the logic block 12 and the translator circuits 14 and 16 is selected to provide the proper logic levels to the output stage 20. The necessary inversion to drive the output stage 20 in the first mode can be provided either by adjusting the polarity of the input logic signals 13 and 15, or the polarity of translator circuits 14 and 16.

The first translator circuit 14 has a power terminal, an input for receiving the first logic input signal, and an output coupled to the first input 23 of the N-channel output stage for providing a boosted logic output signal in a logic high polarity state. The second translator circuit 16 has a power terminal, an input for receiving the second logic input signal, and an output coupled to the second input 25 of the N-channel output stage for providing a boosted logic output signal in a logic high polarity state. As previously explained, the outputs of the first and second translator circuits 14 and 16 are complementary for properly driving the output stage 20 and are both low for placing the output stage 20 into a tristate mode. The boost voltage generator 18 has a boosted voltage output 34 respectively coupled to the power terminals of the first and second translator circuits 14 and 16.

Figure 1A:
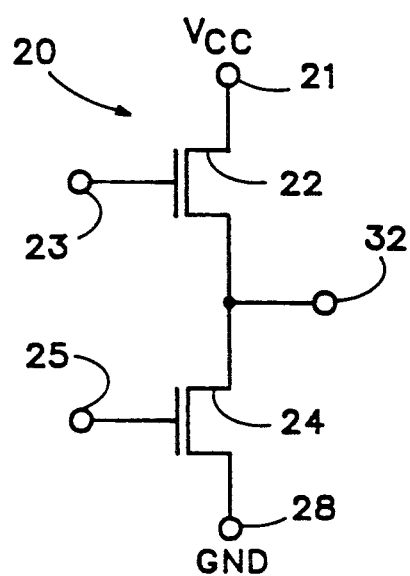
FIGS. 1A-1B are schematic diagrams of two types of output stages.
Figure 1B:
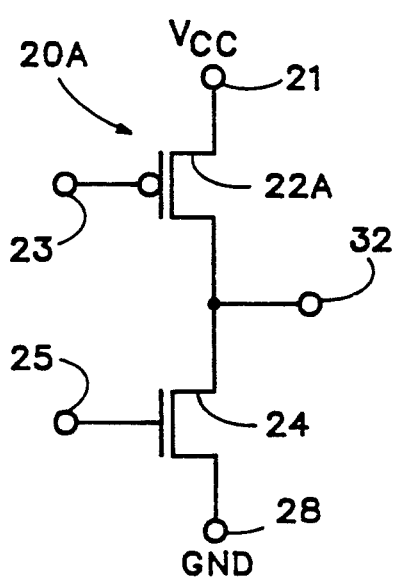
Figure 3:
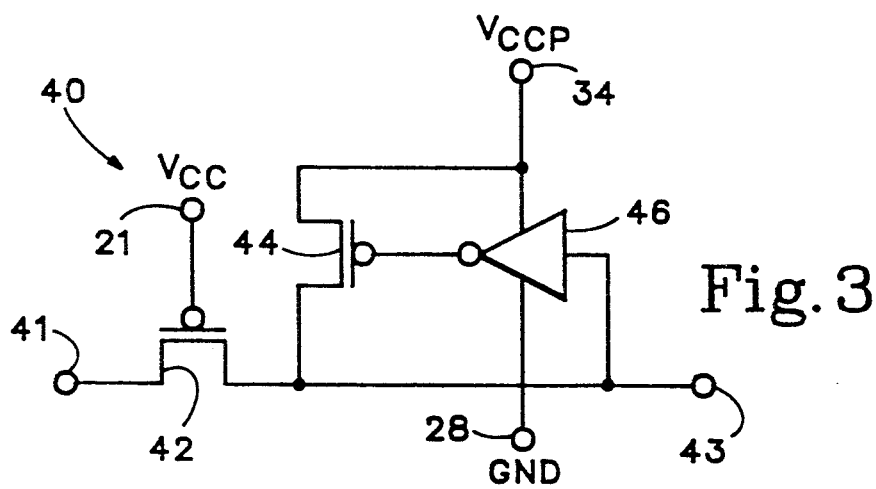
FIGS. 3-4 are schematic diagrams of translator circuits suitable for use in the output driver circuit of FIG. 2.

A noninverting translator circuit 40 suitable for use as the first or second translator circuit 14 or 16 is shown in FIG. 3 and includes an N-channel pass transistor 42, a P-channel transistor 44, and an inverter 46. The pass transistor 42 has a gate 21 coupled to the positive supply voltage, $V_{CC}$, a first controlled node (drain or source since field-effect transistors are symmetrical) forming the input 41 of the translator circuit, and a second controlled node forming the output 43 of the translator circuit 40. The P-channel transistor 44 has a first controlled node forming the power terminal of the translator circuit coupled to the boosted voltage, $V_{CCP}$, at terminal 34. The second controlled node of the P-channel transistor 44 is coupled to the output of the translator circuit 43. The inverter 46 has an input coupled to the output 43 of the translator circuit, an output coupled to the gate of the P-channel transistor 44. The positive power terminal of the inverter 46 is coupled to the power terminal of the translator circuit 40 at terminal 34.

Figure 6:
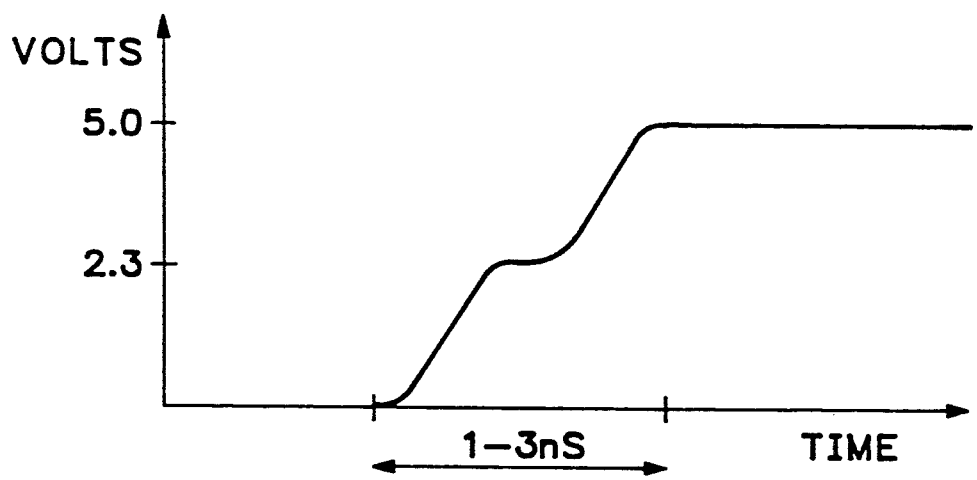
FIG. 6 is a plot of the typical voltage characteristics versus time of the output of the translator circuit of FIG. 3.

In operation, the translator circuit 40 of FIG. 3 converts a reduced voltage logic high of about 3.3 volts to a boosted voltage logic high of about 5 volts. The N-channel pass transistor 42 applies the input voltage to the output terminal 43. The reduced voltage logic high is coupled to the input of the inverter 46 and is sufficient to change logic states of the inverter. The inverter 46 provides a logic low to the gate of the P-channel transistor 44, which causes transistor 44 to conduct. Since the source of the P-channel transistor 44 is coupled to the boosted voltage supply, $V_{CCP}$, the drain, which is output terminal 43, is pulled high. Therefore, a short time after a logic high is presented to the input terminal 41, a boosted logic high appears at the output terminal 43. This is best seen in the plot of voltage versus time of terminal 43 in FIG. 6. Terminal 43 initially switches to 2.3 volts because of the voltage drop across the pass transistor 42, then switches to 5 volts once the inverter 46 changes logic states. Total switching time takes between 1 and 3 nanoseconds, depending upon the semiconductor process and transistor size. If a logic low is presented at input terminal 41, the inverter 46 provides a logic low to the gate of the P-channel transistor 44, which causes transistor 44 to turn off. Since the P-channel transistor 44 is off, the drain presents a high impedance to the output terminal 43, which remains low.

Figure 4:
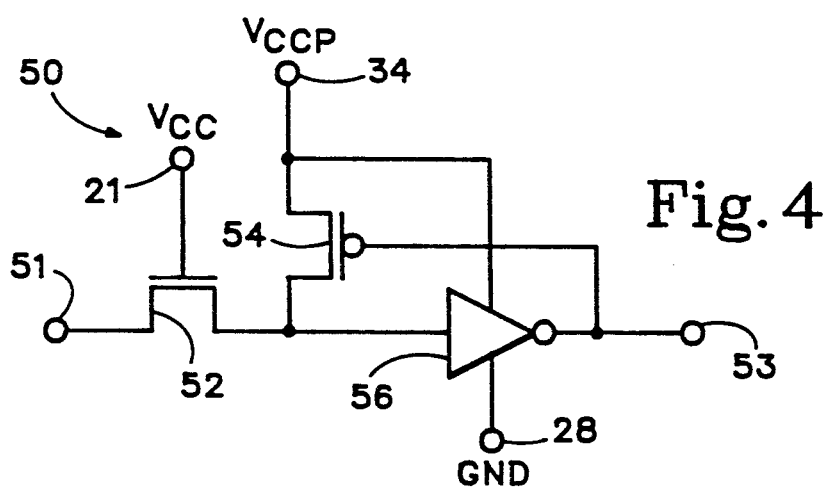

An inverting translator circuit 50 suitable for use as the first or second translator circuits 14 or 16 is shown in FIG. 4 and includes an N-channel pass transistor 52, A P-channel transistor 54, and an inverter 56. The pass transistor 52 has a gate coupled to the positive supply voltage, $V_{CC}$, a first controlled node forming the input 51 of the translator circuit, and a second controlled node. The P-channel transistor 54 has a gate forming the output 53 of the translator circuit 50. A first controlled node forms the power terminal of the translator circuit coupled to the boosted voltage, $V_{CCP}$, at terminal 34. A second controlled node of the P-channel transistor 54 is coupled to the second controlled node of the pass transistor 52. The inverter 56 has an input coupled to the second controlled node of the pass transistor 52 and an output coupled to the output 53 of the translator circuit. The positive power terminal of the inverter 56 is coupled to the power terminal of the translator circuit 50 at terminal 34.

In operation, the inverting translator circuit 50 of FIG. 4 converts a logic zero to a boosted voltage logic one of about 5 volts. The N-channel pass transistor 52 applies the input voltage of zero volts to the input of the inverter 56. The output of inverter 56 provides a logic high to the gate of the P-channel channel transistor 54, which causes transistor 54 to turn off. Since the P-channel transistor 54 is off, the drain presents a high impedance to the output terminal 53, which remains low. In the case of a reduced voltage logic high of about 2.3 volts, the logic high is coupled to the input of the inverter 56 and is sufficient to change logic states of the inverter. The inverter 56 provides a logic low to the gate of the P-channel transistor 54, which causes transistor 54 to conduct. Since the source of the P-channel transistor 54 is coupled to the boosted voltage supply, $V_{CCP}$, the drain, which is coupled to the input of the inverter 56 is pulled high, thus ensuring a logic zero at terminal 53. The P-channel transistor 54 is desirably included to prevent any possibility of DC current flow through inverter 56.

Figure 5:
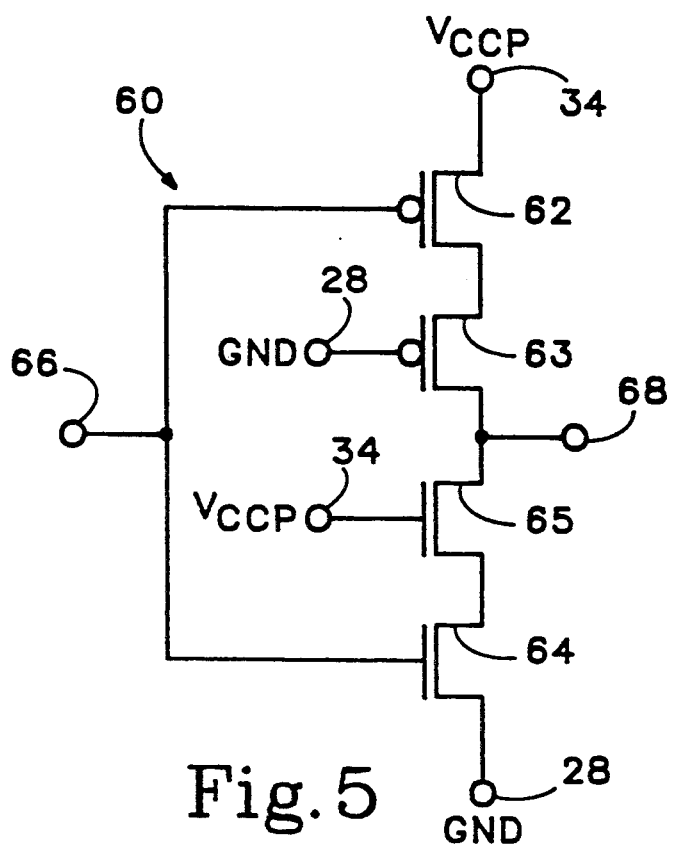
FIG. 5 is a schematic diagram of an inverter suitable for use in the translator circuits of FIGS. 3-4.

An inverter 60 is shown in FIG. 5 that is suitable for use as the inverters 46 and 56 in the translator circuits 14 and 16. The source of a first P-channel transistor 62 forms the power terminal of the inverter coupled to the boosted power supply voltage, $V_{CCP}$. A second actively-biased P-channel transistor 63 has a source coupled to the drain of the first P-channel transistor 62. A first N-channel transistor 64 has a source coupled to ground. A second actively-biased N-channel transistor 65 has a source coupled to the drain of the first N-channel transistor 64. The gates of the first P-channel transistor 62 and the first N-channel transistor 64 are coupled together to form the input 66 of inverter 60. The drains of the second P-channel transistor 63 and the second N-channel transistor 65 are coupled together to form the output 68 of inverter 60. Transistors 63 and 65 are included to reduce the total voltage and consequently, electric field, across each of the four transistors.

Figure 7:
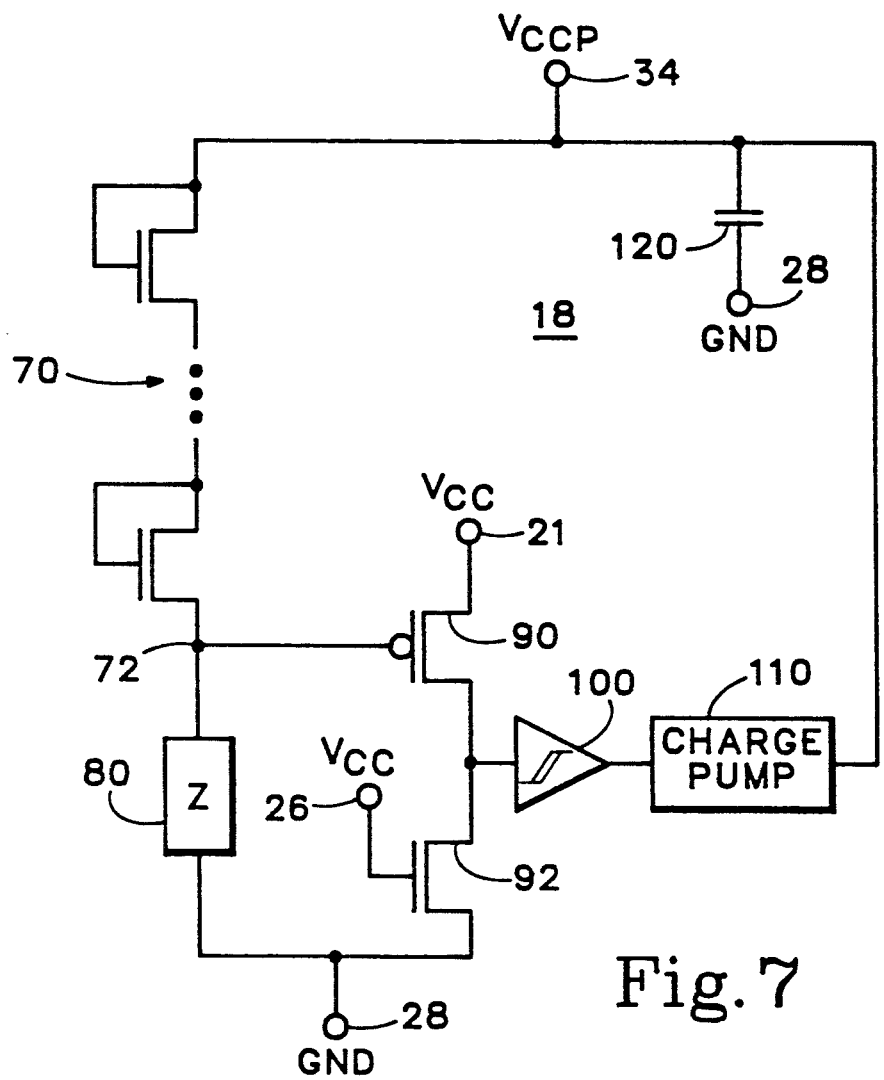
FIG. 7 is a combined block/schematic diagram of a boosted voltage generator suitable for use with the output driver circuit of FIG. 2.

A boost voltage generator 18 is shown in greater detail in FIG. 7 and includes a level shifting circuit 70 having an input coupled to the boosted voltage and a voltage shifted output 72. A load element 80 is coupled between the output 72 of the level shifting circuit and ground. An inverter 90, 92 has input coupled to the output 72 of the level shifting circuit and an output formed at the coupled drains of a P-channel transistor 90 and an N-channel transistor 92. If desired, an hysteresis stage 100 can be included in the output of the inverter to provide a sharp control signal with no bouncing. A charge pump 110 has an input coupled to the output of the inverter 90, 92 or the hysteresis stage 100 and an output coupled to the boosted voltage output, $V_{CCP}$, at node 34.

In operation, the boosted voltage is maintained by the action of the charge pump 110, which is periodically turned on if the boosted voltage drops below a predetermined value. When the boosted value changes from a nominal value, a sense circuit including the level shifting circuit 70 and the load element 80 provides a control voltage to turn on the charge pump 110. In turn, the charge pump pumps charge into the boosted voltage terminal 34 until the boosted voltage $V_{CCP}$ returns to the nominal value. The sense circuit then provides a control voltage to turn off the charge pump 110.

If desired, the level shifting circuit 70 can include one or more serially-connected diodes or diode connected transistors. The load element 80 can be a polysilicon resistor, a well of a first polarity type integrated in a semiconductor substrate of a second polarity type, or the drain-to-source resistance of a transistor.

Figure 9:
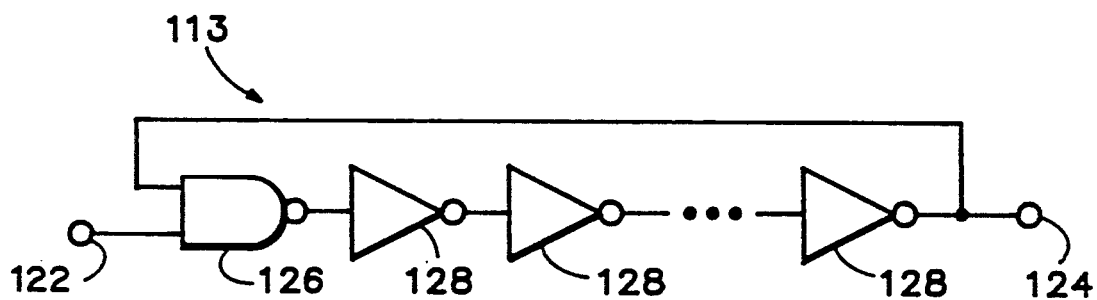
FIG. 9 is a detailed schematic diagram of the ring oscillator depicted in FIG. 8.
Figure 8:
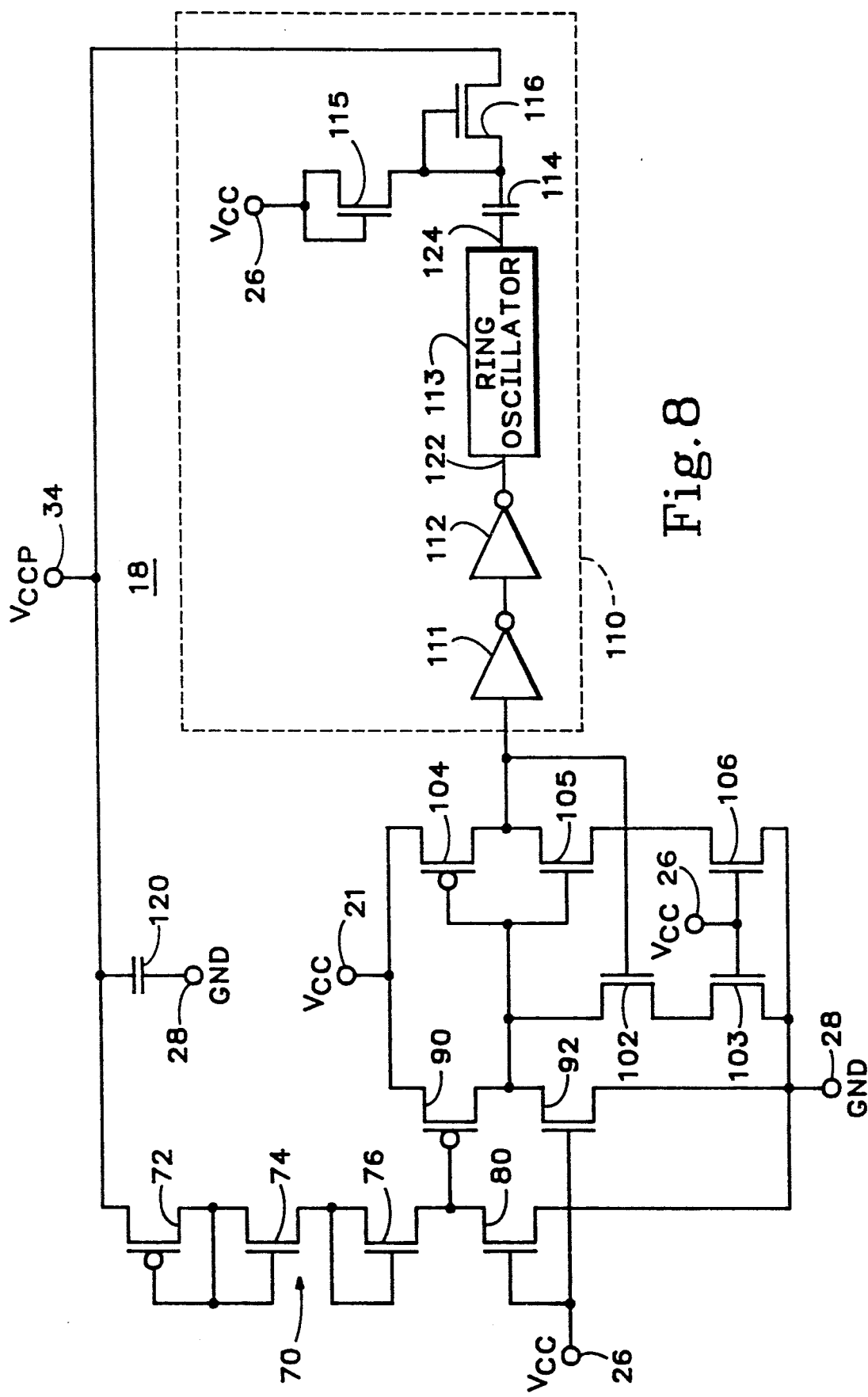
FIG. 8 is a more detailed block/schematic diagram of the boosted voltage generator of FIG. 6.

The boosted voltage generator 18 is shown in greater detail in FIG. 8. The level shifting circuit 70 includes two diode connected N-channel transistors 74 and 76 and a diode connected P-channel transistor 72. The P-channel transistor 72 is a level shifting element that provides a better match in threshold voltage shift with P-channel transistor 90 over process variations. The load element 80 is shown as the drain to source resistance of an actively biased N-channel transistor 80. The hysteresis function is provided by an inverter including transistors 104 and 105 having a feedback circuit including transistors 102, 103, and 106. A variable resistive path is presented to ground to create the hysteresis. In one mode, transistor 102 is biased off and the resistance coupled to the P-channel transistor 90 is provided by N-channel transistor 92. In another mode, transistor 102 is biased on and the resistance coupled to the P-channel transistor 90 is equal to the parallel combination of transistors 92 and 102. The charge pump 110 includes an even number of serially-connected inverter stages such as inverters 111 and 112, the input of the first inverter forming the input of the charge pump 110. Inverters 111 and 112 are used to buffer the drive signal from the inverter 90, 92. A ring oscillator 113 has an input 122 coupled to the output of a last inverter stage and an output 124 for providing an oscillating digital signal. As shown in greater detail in FIG. 9, the ring oscillator 113 typical includes an odd number of inverters such as NAND gate 126 and serially-connected inverter stages 128. The ring oscillator 113 can also incorporate inverters 111 and 112. The input of a first inverter stage or NAND gate 126 forms the input 122 of the ring oscillator 113 and the output 124 of a last inverter stage forms the output 124 of the ring oscillator 113. The output of the last inverter stage is also coupled directly or through NAND gate 126 to the input of the first inverter stage to create the oscillation. Referring back to FIG. 8, a capacitor 114 is coupled to the output of the ring oscillator 113. A first diode 115 has an anode coupled to the low voltage supply voltage VCC and a cathode coupled to the capacitor 114. A second diode 116 has an anode coupled to the capacitor and a cathode forming the output of the charge pump 110.

In operation, the digital oscillating signal of the ring oscillator 113 in conjunction with the capacitor 114 and diodes 115 and 116, provide a means for delivering charge in one direction to terminal 34. When the oscillating signal is at a logic low, the junction of the two diodes 115 and 116 is at about 3 volts, the charge on capacitor 114 also being about 3 volts. When the oscillating signal switches to a logic high, the junction between the two diodes is boosted to over five volts. Thus, diode 115 is off and diode 116 is on, delivering charge to the boosted voltage terminal.

It has been demonstrated that an output driver circuit is implemented with a simple design using a minimum number of circuit elements. The translator circuits used in the output driver circuit have no critical timing or delay paths. The configuration of the output driver circuit has two independent voltage outputs for increasing the voltage drive at the gates of both of the output transistors. The higher gate voltage provided by the output driver circuit for both the pullup and pulldown output transistors establishes a valid output logic level having both a higher logic high level and a lower logic low level. Since the drive to the gates of the output drivers is provided by the output driver circuit, the output voltage of the output stage is substantially isolated from the noise and fluctuations of the external power supply. Also because of the higher drive voltages, smaller output devices with lower capacitance can be used.

Having illustrated and described the principles of my invention in a preferred embodiment, it should be readily apparent to those skilled in the art that the invention can be modified in arrangement and detail without departing from such principles. For example, the exact circuitry of the first and second translator circuits 14 and 15 can be modified without departing from the scope of the invention. Therefore, we claim all modifications coming within the true spirit and scope of the accompanying claims.

We claim:

1. An output circuit comprising:
   an N-channel output stage having first and second inputs and a power terminal coupled to a non-boosted voltage supply;
   a first translator circuit having a power terminal, an input for receiving a first logic input signal, and an output coupled to the first input of the N-channel output stage for providing a boosted logic output signal in a logic high polarity state;
   a second translator circuit having a power terminal, an input for receiving a second logic input signal, and an output coupled to the second input of the N-channel output stage for providing a boosted logic output signal in a logic high polarity state; and
   a boost voltage generator having a boosted voltage output respectively coupled to the power terminals of the first and second translator circuits.

2. An output circuit as in claim 1 in which at least one of the first and second translator circuits comprise:
   means for coupling one of the first and second logic signals to the output; and
   single inverter means for sensing a logic high level at the output and thereafter providing a boosted logic high level to the output.

3. An output circuit as in claim 2 in which the coupling means comprises a pass transistor having a control node coupled to a source of constant supply voltage, a first controlled node forming the input of the translator circuit, and a second controlled node forming the output of the translator circuit.

4. An output circuit as in claim 2 in which the single inverter means comprises:
   a P-channel transistor having a control node, a first controlled node forming the power terminal of the translator circuit, and a second controlled node coupled to the output of the translator circuit; and
   an inverter having an input coupled to the output of the translator circuit, an output coupled to the control node of the P-channel transistor, and a power terminal coupled to the power terminal of the translator circuit.

5. An output circuit as in claim 4 in which the inverter comprises:
   a first P-channel transistor having a gate, a drain, and a source forming the power terminal of the inverter;
   a second actively-biased P-channel transistor having a drain and a source coupled to the drain of the first P-channel transistor;

a first N-channel transistor having a gate, a drain, and a source coupled to ground;

a second actively-biased N-channel transistor having a drain and a source coupled to the drain of the first N-channel transistor, wherein the gates of the first P-channel and the first N-channel transistors are coupled together to form the input, and the drains of the second P-channel and the second N-channel transistors are coupled together to form the output.

6. An output circuit as in claim 1 in which at least one of the first and second translator circuits comprise:

means for coupling one of the first and second logic signals to an intermediate node; and single inverter means for sensing a logic high level at the intermediate node and thereafter providing a boosted logic high level to the output.

7. An output circuit as in claim 6 in which the coupling means comprises a pass transistor having a control node coupled to a source of constant supply voltage, a first controlled node forming the input of the translator circuit, and a second controlled node coupled to the intermediate node.

8. An output circuit as in claim 6 in which the single inverter means comprises:

a P-channel transistor having a control node forming the output of the translator circuit, a first controlled node forming the power terminal of the translator circuit, and a second controlled node coupled to the intermediate node; and an inverter having an input coupled to the intermediate node, an output forming the output of the translator circuit, and a power terminal coupled to the power terminal of the translator circuit.

9. An output circuit as in claim 8 in which the inverter comprises:

a first P-channel transistor having a gate, a drain, and a source forming the power terminal of the inverter;

a second actively-biased P-channel transistor having a drain and a source coupled to the drain of the first P-channel transistor;

a first N-channel transistor having a gate, a drain, and a source coupled to ground;

a second actively-biased N-channel transistor having a drain and a source coupled to the drain of the first N-channel transistor, wherein the gates of the first P-channel and the first N-channel transistors are coupled together to form the input, and the drains of the second P-channel nd the second N-channel transistors are coupled together to form the output.

10. An output circuit as in claim 1 in which the boost voltage generator comprises:

a level shifting circuit having first and second nodes, the first node being coupled to the boosted voltage output;

a load element coupled between the second node of the level shifting circuit and ground;

an inverter having an input, an output, and the input being coupled to the second node of the level shifting circuit;

a charge pump having an input coupled to the output of the inverter and an output coupled to the boosted voltage output; and a capacitor coupled between the boosted voltage output and ground.

11. An output circuit as in claim 10 in which the level shifting circuit comprises one or more serially-connected diodes.

12. An output circuit as in claim 10 in which the load element comprises a polysilicon resistor.

13. An output circuit as in claim 10 in which the load element comprises a well of a first polarity type integrated in a semiconductor substrate of a second polarity type.

14. An output circuit as in claim 10 in which the load element comprises the drain-to-source resistance of a transistor.

15. An output circuit as in claim 10 in which the inverter comprises a hysteresis switching-threshold inverter.

16. An output circuit as in claim 10 in which the charge pump comprises:

an even plurality of serially-connected inverter stages, each inverter stage having an input and an output, the input of a first inverter stage forming the input of the charge pump;

a ring oscillator having an input and an output, the input being coupled to the output of a last inverter stage;

a capacitor having a first node and a second node, the first node being coupled to the output of the ring oscillator;

a first diode having an anode coupled to a source of constant supply voltage and a cathode coupled to the second node of the capacitor; and a second diode having an anode coupled to the second node of the capacitor and a cathode forming the output of the charge pump.

17. An output circuit as in claim 16 in which the ring oscillator comprises an odd plurality of serially-connected inverter stages, each inverter having an input and an output, the input of a first inverter stage forming the input of the ring oscillator, the output of a last inverter stage forming the output of the ring oscillator, and the output of the last inverter stage being coupled to the input of the first inverter stage.

18. A method for driving an N-channel output stage having first and second inputs and a power terminal, the method comprising:

generating a first and second input logic signals;

translating the first input logic signal into a first boosted logic signal, wherein the first boosted logic signal has a logic high level greater than a logic high level of the first input logic signal;

translating the second input logic signal into a second boosted logic signal, wherein the second boosted logic signal has a logic high level greater than a logic high level of the second input logic signal;

driving the first input of the N-channel output stage with the first boosted logic signal;

driving the second input of the N-channel output stage with the second boosted logic signal; and coupling the power terminal of the N-channel output stage to a non-boosted voltage supply.

19. A method for driving an N-channel output stage as in claim 18 in which the step of translating the first input logic signal comprises:

coupling the first logic signals to the first input of the N-channel output stage;

sensing a logic high level at the first input of the N-channel output stage; and providing a boosted logic high level to the first input of the N-channel output stage.

20. A method for driving an N-channel output stage as in claim 18 in which the step of translating the second input logic signal comprises:
- coupling the second logic signals to the second input of the N-channel output stage;
- sensing a logic high level at the second input of the N-channel output stage; and
- providing a boosted logic high level to the second input of the N-channel output stage.

21. A method for driving an N-channel output stage as in claim 18 in which the step of translating the first input logic signal comprises:
- coupling the first logic signal to an intermediate node;
- sensing a logic high level at the intermediate node; and
- providing a boosted logic high level to the first input of the N-channel output stage.

22. A method for driving an N-channel output stage as in claim 18 in which the step of translating the second input logic signal comprises:
- coupling the second logic signal to an intermediate node;
- sensing a logic high level at the intermediate node; and
- providing a boosted logic high level to the second input of the N-channel output stage.

* * * * *